(12) United States Patent
Deng

(10) Patent No.: US 10,861,965 B2
(45) Date of Patent: Dec. 8, 2020

(54) POWER MOSFET WITH AN INTEGRATED PSEUDO-SCHOTTKY DIODE IN SOURCE CONTACT TRENCH

(71) Applicant: Renesas Electronics America Inc., Milpitas, CA (US)

(72) Inventor: Shengling Deng, Chandler, AZ (US)

(73) Assignee: Renesas Electronics America Inc., Milpitas, CA (US)

(*) Notice: Subject to any disclaimer, the term of this patent is extended or adjusted under 35 U.S.C. 154(b) by 0 days.

(21) Appl. No.: 16/396,473

(22) Filed: Apr. 26, 2019

(65) Prior Publication Data

US 2020/0020798 A1 Jan. 16, 2020

Related U.S. Application Data

(60) Provisional application No. 62/697,193, filed on Jul. 12, 2018.

(51) Int. Cl.
| | |
|---|---|
| *H01L 29/78* | (2006.01) |
| *H01L 29/10* | (2006.01) |
| *H01L 29/06* | (2006.01) |
| *H01L 29/423* | (2006.01) |
| *H01L 29/40* | (2006.01) |
| *H01L 29/66* | (2006.01) |

(52) U.S. Cl.
CPC ...... *H01L 29/7813* (2013.01); *H01L 29/0696* (2013.01); *H01L 29/1095* (2013.01); *H01L 29/404* (2013.01); *H01L 29/407* (2013.01); *H01L 29/4236* (2013.01); *H01L 29/66727* (2013.01); *H01L 29/66734* (2013.01); *H01L 29/7806* (2013.01)

(58) Field of Classification Search
CPC ............ H01L 29/7806; H01L 29/4236; H01L 29/0696; H01L 29/7813; H01L 29/1095; H01L 29/41766

See application file for complete search history.

(56) References Cited

U.S. PATENT DOCUMENTS

| | | | |
|---|---|---|---|
| 5,856,700 A | 1/1999 | Woodbury | |
| 6,351,018 B1* | 2/2002 | Sapp | H01L 29/7813 257/499 |
| 8,492,225 B2 | 7/2013 | Girdhar et al. | |
| 8,921,186 B2 | 12/2014 | Shea et al. | |
| 8,962,425 B2 | 2/2015 | Shen et al. | |
| 9,099,519 B2 | 8/2015 | Shen et al. | |
| 9,209,173 B2 | 12/2015 | Hebert | |
| 9,269,779 B2 | 2/2016 | Deng et al. | |
| 9,530,883 B2 | 12/2016 | Deng et al. | |
| 9,842,925 B2 | 12/2017 | Deng et al. | |
| 10,629,723 B2* | 4/2020 | Lin | H01L 29/66143 |
| 2019/0123194 A1 | 4/2019 | Shea | |

* cited by examiner

*Primary Examiner* — Mark V Prenty
(74) *Attorney, Agent, or Firm* — Foley & Lardner LLP

(57) ABSTRACT

The present embodiments provide a region of a semiconductor device comprising a plurality of power transistor cells configured as trench MOSFETs in a semiconductor substrate. At least one active power transistor cell further includes a trenched source region wherein a trench bottom surface of the trenched source contact is covered with an insulation layer and layer of a conductive material on top of the insulation layer, to function as an integrated pseudo Schottky barrier diode in the active power transistor cell.

18 Claims, 17 Drawing Sheets

POWER MOSFET WITH AN INTEGRATED PSEUDO-SCHOTTKY DIODE IN SOURCE CONTACT TRENCH

CROSS-REFERENCE TO RELATED PATENT APPLICATIONS

The present application claims priority to U.S. Provisional Application No. 62/697,193, filed Jul. 12, 2018, the contents of which are incorporated herein by reference in their entirety.

TECHNICAL FIELD

The present embodiments relate generally to semiconductor devices and more particularly to novel power MOSFET devices.

BACKGROUND

Insulated gate field effect transistors (IGFETs), such as metal oxide semiconductor field effect transistors (MOSFETs), have been used in many power switching applications, such as dc-dc converters. In a typical MOSFET, a gate electrode provides turn-on and turn-off control with the application of an appropriate gate voltage. By way of example, in an n-type enhancement mode MOSFET, turn-on occurs when a conductive n-type inversion layer (i.e., channel region) is formed in a p-type body region in response to the application of a positive gate voltage, which exceeds an inherent threshold voltage. The inversion layer connects n-type source regions to n-type drain regions and allows for majority carrier conduction between these regions.

Due to their construction, MOSFETs have an intrinsic body diode between the source region and the drain region. For example, in an n-channel enhancement mode MOSFET, the body diode is formed between the p+ well of the source and the n−region of the drain. This body diode conducts current which is known as reverse current even when the MOSFET is off. The MOSFET cannot be turned on fully until the body diode conduction is negligible. MOSFET body diode conduction is a problem can badly affect the design of any system especially the ones that include MOSFET switching circuits. Some examples of such circuits include SMPS, DC-DC converters, and more. The problem of body diode conduction occurs in both trench and planar MOSFETs.

Past efforts to reduce the effect of body diode conduction in trench MOSFETs include integrating a Schottky diode at the bottom of the source trenches or opening up the bottom of source trenches into the region p-epi or n-epi region below the source region. Specifically, a Schottky diode is incorporated by depositing a metal layer on the walls and at the bottom of source contact trenches. However, this configuration creates an ohmic contact between the side walls of the source trenches and the surrounding semiconductor region and a Schottky contact between the bottom portion of the source trenches and the semiconductor region underneath the same. Even though this may help reduce the reverse leakage current through the MOSFET, it is not negligible as the metal layer is in direct contact with the semiconductor.

Additionally, depositing such a metal layer may require additional photo resistive masks during the fabrication of the MOSFET which may further increase the production costs.

Thus, it would be advantageous to have a MOSFET device configuration that has negligible body diode conduction and which can be fabricated without any extra masks during fabrication.

SUMMARY

The present embodiments provide a solution for a reduced body diode conduction in a trench MOSFET by converting a portion of the source contact trench to a Schottky-like device. More particularly, embodiments relate to an improved and novel manufacturing process and device configuration for providing the MOSFET device with cells having pseudo Schottky trench source contacts for improving the performance of high frequency power switching applications.

This configuration results in an ultra-low reverse-recovery charge and soft recovery during MOSFET switching in DC-DC converter. It can significantly improve the MOSFET switching waveform, leading to more robust device performance and better efficiency. Embodiments are fully compatible with standard discrete trench MOSFET devices, and are cost-effective in that they only require one additional mask layer with a few extra process steps. Unlike a normal integrated-Schottky approach, the proposed structure does not require a dedicated area for the Schottky, thus making full use of the active area. Moreover, it does not require the development and tuning of a Schottky contact recipe, which can potentially shorten the development time.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

Figure 1:
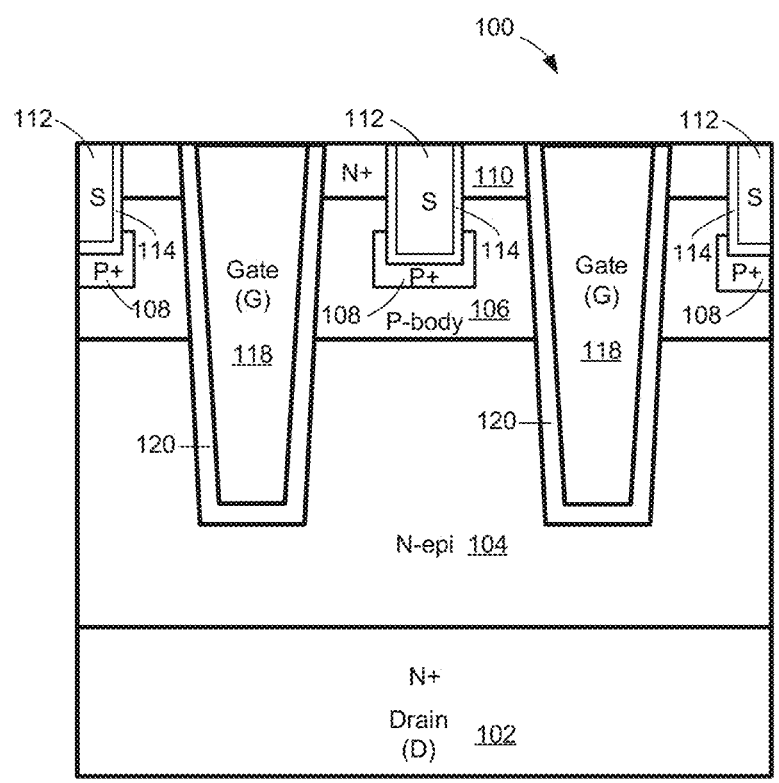
FIG. 1 illustrates a partial vertical cross-sectional view of an example semiconductor device comprising a plurality of basic (TMOS) cells having a first configuration.

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

For simplicity and clarity of illustration, elements in the figures are not necessarily drawn to scale, and the same reference numbers in different figures denote generally the same elements. Additionally, numerals for similar portions in the figures, have been shown when necessary to understand the description. Additionally, descriptions and details of well-known steps and elements may be omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor.

Although the devices are explained herein as certain n-channel devices, a person of ordinary skill in the art understands that p-channel devices and complementary devices are also possible in accordance with the present description. For clarity of the drawings, doped regions of device structures can be illustrated as having generally straight-line edges and precise angular corners; however, those skilled in the art understand that due to the diffusion and activation of dopants, the edges of doped regions are generally not straight lines and the corners are not precise angles. It may be appreciated by those skilled in the art that the semiconductor devices and structures in this specification may be created by any existing standard doping methods MOSFETs or trench MOSFETs. More specifically, the n+, p+, p− body layers or regions may be created by an ion implantation method. The n-epitaxial (n-epi) layer may be created using an epitaxial growth.

Furthermore, the term "major surface" when used in conjunction with a semiconductor region or substrate means the surface of the semiconductor region or substrate that forms an interface with another material, such as a dielectric, an insulator, a conductor, or a polycrystalline semiconductor. The major surface can have a topography that changes in the x, y and z directions.

In the present specification, the term "semiconductor device" may be alternately used with the term "MOSFET". "MOSFET" may be alternately used with "TMOS cell" or "P-Sch cell". "TMOS cell" may be alternately used with "TMOS". "P-Sch cell" may be alternately used with "P-Sch MOS". The term "structure" may be alternately used with the term "unit".

In addition, structures of the present disclosure can embody either a cellular-based design (in which the body regions are a plurality of distinct and separate cellular or stripe regions) or a single-base design (in which the body region is a single region formed in an elongated pattern, typically in a serpentine pattern or a central portion with connected appendages). However, one embodiment of the present description will be described as a cellular base design throughout the description for ease of understanding. It should be understood that the present disclosure encompasses both a cellular-base design and a single-base design.

In general, one skilled in the art can appreciate that an insulated gate semiconductor device structure according to an embodiment may comprise a region of semiconductor material including a semiconductor substrate, a first semiconductor layer of a first conductivity type and a first dopant concentration on the semiconductor substrate, and a second semiconductor layer on the first semiconductor layer, the second semiconductor layer having the first conductivity type, having a second dopant concentration greater than the first dopant concentration, and having a major surface. The structure includes a body region of a second conductivity type in the second semiconductor layer extending from the major surface. The structure includes a trench structure in the first semiconductor layer and the second semiconductor layer extending from the major surface adjacent the body region. The trench structure comprises a trench terminating with the first semiconductor layer, an insulated gate electrode and an insulated shield electrode below the insulated gate electrode. A source region of the first conductivity type in the body region is adjacent the trench structure. A doped region of the second conductivity type is in the second semiconductor layer adjacent a lower surface of the body region, wherein a portion of the second semiconductor layer separates the doped region from the trench structure.

In general, the present embodiments relate to an insulated gate semiconductor device and a method of manufacture. A first aspect is to provide a pseudo Schottky (P-Sch) source trench region. To achieve this, a trench bottom of a trench source contact is covered with an insulation layer and a layer of a conductive material on top of the insulation layer, to function as a pseudo Schottky barrier diode in the device. The integrated pseudo Schottky barrier diode reduces the body diode conduction, thus improving the device performance. In a MOSFET, the body diode voltage drop is often used as a measure of device performance and therefore often used for comparison. Advantageously, in some embodiments, a P-Sch device as disclosed may reduce body diode voltage drop. The disclosed device may also reduce the reverse recovery charge (Qrr) during diode reverse recovery.

A second aspect is to provide a P-Sch cell with a TMOS source region (TMOS region) and a P-Sch source region (P-Sch region). In other words, the embodiments teach integrating a P-Sch region into a trench MOSFET. The TMOS region of the P-Sch cell may be referred to as a TMOS unit and the P-Sch region of the P-Sch cell may be referred to as a P-Sch unit.

A third aspect is to provide an integrated semiconductor device comprising regular TMOS cells and P-Sch cells arranged such that P-Sch cells are sandwiched between the regular TMOS cells.

An integrated semiconductor device constructed as such may have an improved performance. It may have substantially the same or even greater breakdown voltage ($B_{VDSS}$) than a regular MOSFET or a regular TMOS. Furthermore, it may withstand a higher drain to source current ($I_{DSS}$) over a range of drain to source voltage ($V_{DS}$) than a regular MOSFET or a regular TMOS.

In one embodiment, the device can include a semiconductor substrate, a first layer of a first dopant concentration on the semiconductor substrate, a second layer of a second dopant concentration on the first layer, an insulated trench gate electrode and an insulated trench source electrode. In some embodiments, the trench structure includes a notch or indentation proximate to a body region of the device. In other embodiments, the device can include a localized doped region or regions adjacent to a lower surface of the body region but spaced apart from the trench structure where the doped region has an opposite conductivity type to the second semiconductor layer. In other embodiments, the device can include a doped region adjacent the body region of the device and trench structure where the body region has the same conductivity type as the second semiconductor layer but a higher dopant concentration. In some embodiments, the device can include all of the described features. In some embodiments, the device can include at least one of the described features. In other embodiments, the device can include at least two of the described features. In further embodiments, the device can include at least three of the described features. In still further embodiments, the device can include at least four of the described features. It should be understood that the illustrated embodiments are exemplary only, and should not be taken as limiting the scope of the invention.

Referring to FIG. 1, a partial cross-sectional view of an example semiconductor device comprising a plurality of basic (TMOS) cells having a first configuration is illustrated. The device 100 is an n-channel MOSFET. The MOSFET 100 comprises an n+ type substrate 102, an n− epitaxial layer 104, a p− body region 106, p+ regions 108, an n+ source layer 110, gate oxide layer 120, and gate polysilicon regions (gate poly) 118. The oxide layer 120 may also be referred to as a dielectric layer. The n+ type substrate 102 in this example also forms a drain region. The n− epitaxial layer 104 is grown or deposited on the n+ layer 102. The p-body region 106 is formed on top of the n-epi layer 104 and the n+ layer 110 is deposited on the p-body region 106. The p+ regions 108 are also formed within the p-body 106 underneath the source regions 112. As may be appreciated, the n+ substrate 102 and n+ layer 110 have a higher dopant concentration that n-epi 104 and p+ regions 108 has a higher dopant concentration than p-body region 106. A conductive layer 114 may be deposited at the bottoms and the walls of the trench source regions 112. Conductive layer 114 can be a metal layer. The metal layer 114 forms an Ohmic contact on n+ source region 110 and p-body region 106.

Figure 2:
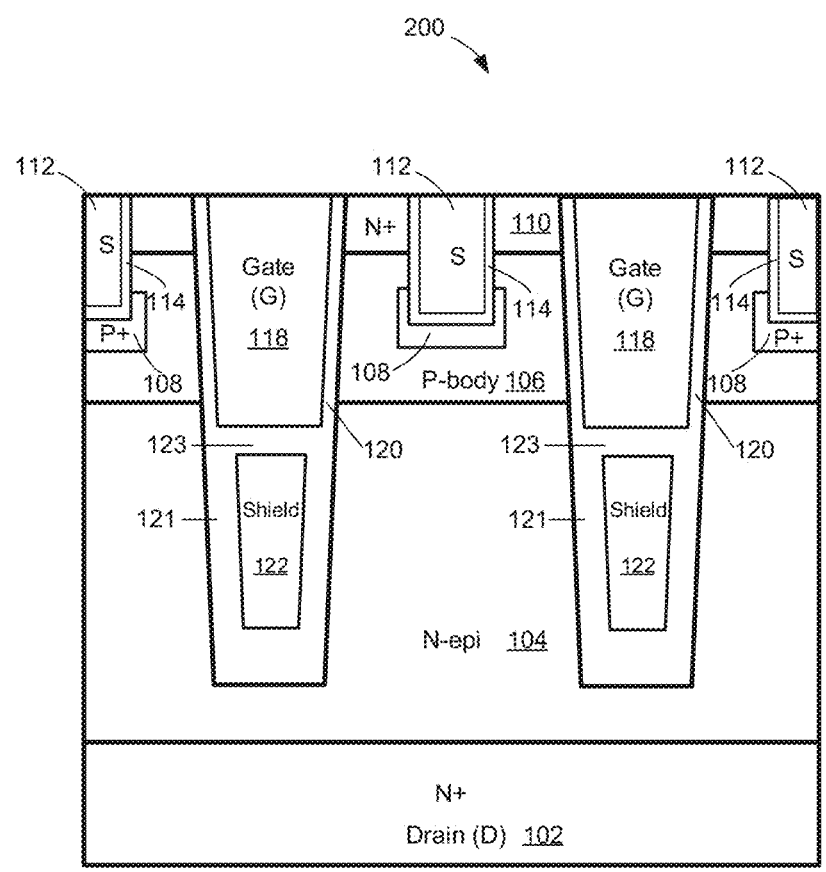
FIG. 2 illustrates a partial vertical cross-sectional view of another example of a semiconductor device comprising a plurality of basic (TMOS) cells having a second configuration.

Referring to FIG. 2, a partial cross-sectional view of another example of a semiconductor device 200 comprising a plurality of basic (TMOS) cells having a second configuration is illustrated. The device 200 shares most of its common structural features with the device 100 of FIG. 1. Its configuration differs from that of the MOSFET 100 in a way that the trench gate regions are shielded regions. The TMOS cell per this configuration may also be referred to as a TMOS cell with shielded gate trench regions. As can be seen, there are shield polysilicon regions (shield poly) 122 that are recessed in the gate trench regions 118. The gate poly 118 and shield poly 122 in the trenches are surrounded by oxide layers (gate oxide 120, shield oxide 121, and inter poly oxide 123). The oxide layers may also be referred to as dielectric layers. More specifically, the gate poly 118 are surrounded by gate oxide 120, and the shield poly are surrounded by shield oxide 121. The gate poly 118 and shield poly 122 are separated by an inter poly oxide 123. These oxide layers are formed at different process steps by similar or different process methods. The thicknesses of different oxide layers are also different. Typically, the shield oxide 121 is thicker than gate oxide 120.

The shielded regions may further improve the device performance by reducing the on resistance and the gate charge. The device configuration as shown in FIGS. 1 and 2 are standard configurations of textbook trench MOSFET structures, which can be found in most textbooks, trench MOSFET publications, and patents including U.S. Pat. No. 9,269,779 B2, entitled "Insulated Gate Semiconductor Device Having A Shield Electrode Structure" which is incorporated herein by reference in its entirety.

Figure 3:
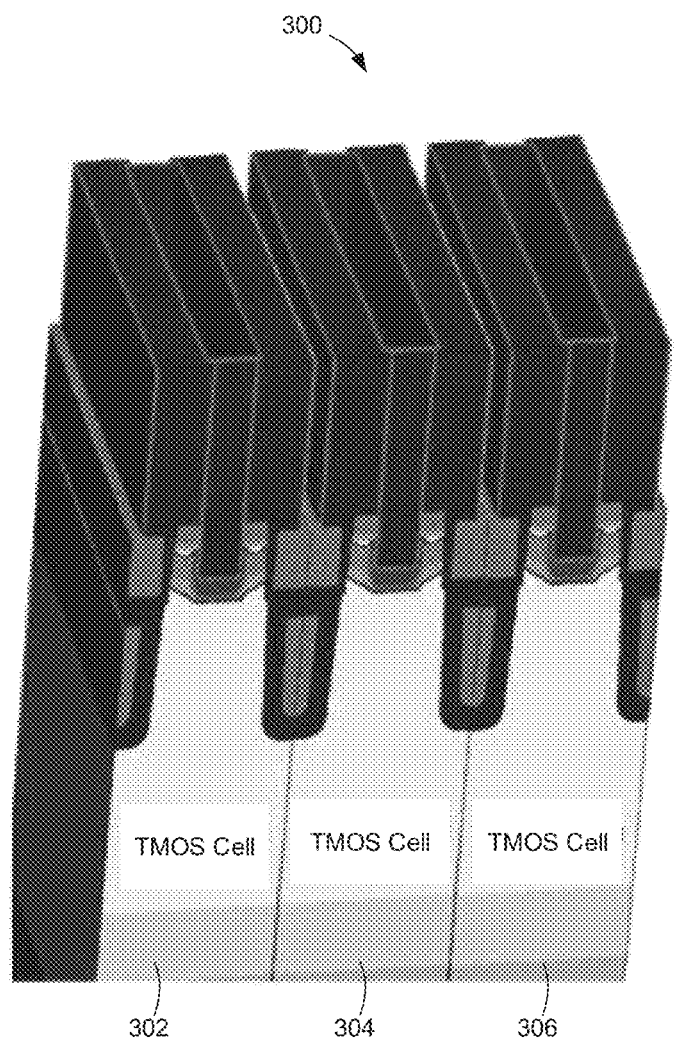
FIG. 3 illustrates a partial three dimensional view of a possible semiconductor device including a plurality of basic (TMOS) cells as shown in FIG. 2.

For assistance in understanding aspects of the present embodiments, FIG. 3 provides a partial three dimensional view of a possible semiconductor device 300 including a plurality of basic (TMOS) cells 302, 303, 304. The TMOS cells 302, 304, and 306 are shown as having shielded gate trench regions as per the conventional configuration in FIG. 2.

Figure 4:
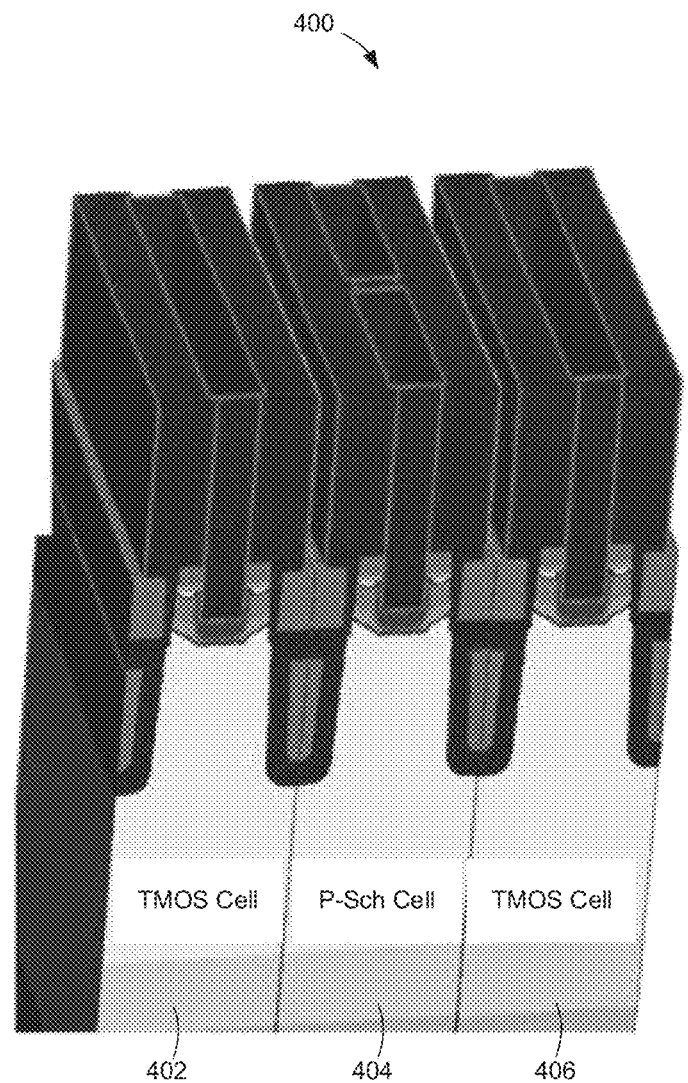
FIG. 4 illustrates a partial three dimensional view of an integrated semiconductor device comprising a plurality of basic TMOS cells and a pseudo Schottky cell according to an embodiment of the present disclosure.

By comparison to FIG. 3, FIG. 4 illustrates a partial three dimensional view of an integrated semiconductor device comprising a plurality of regular (basic) TMOS cells 402, 406 and a pseudo Schottky (P-Sch) cell 404 sandwiched between the TMOS cells, according to an embodiment of the present disclosure. It may be appreciated that the TMOS cells and the P-Sch cells are disposed on a common semiconductor substrate adjacent to and touching each other. In other embodiments, the P-Sch cells may be repeated after a few TMOS cells depending on design considerations. In general, in one example, the ratio of P-Sch cells to TMOS cells may be one-fifth. A few possible configurations or structures of the P-Sch cell per this disclosure will be explained in more detail below.

Figure 5:
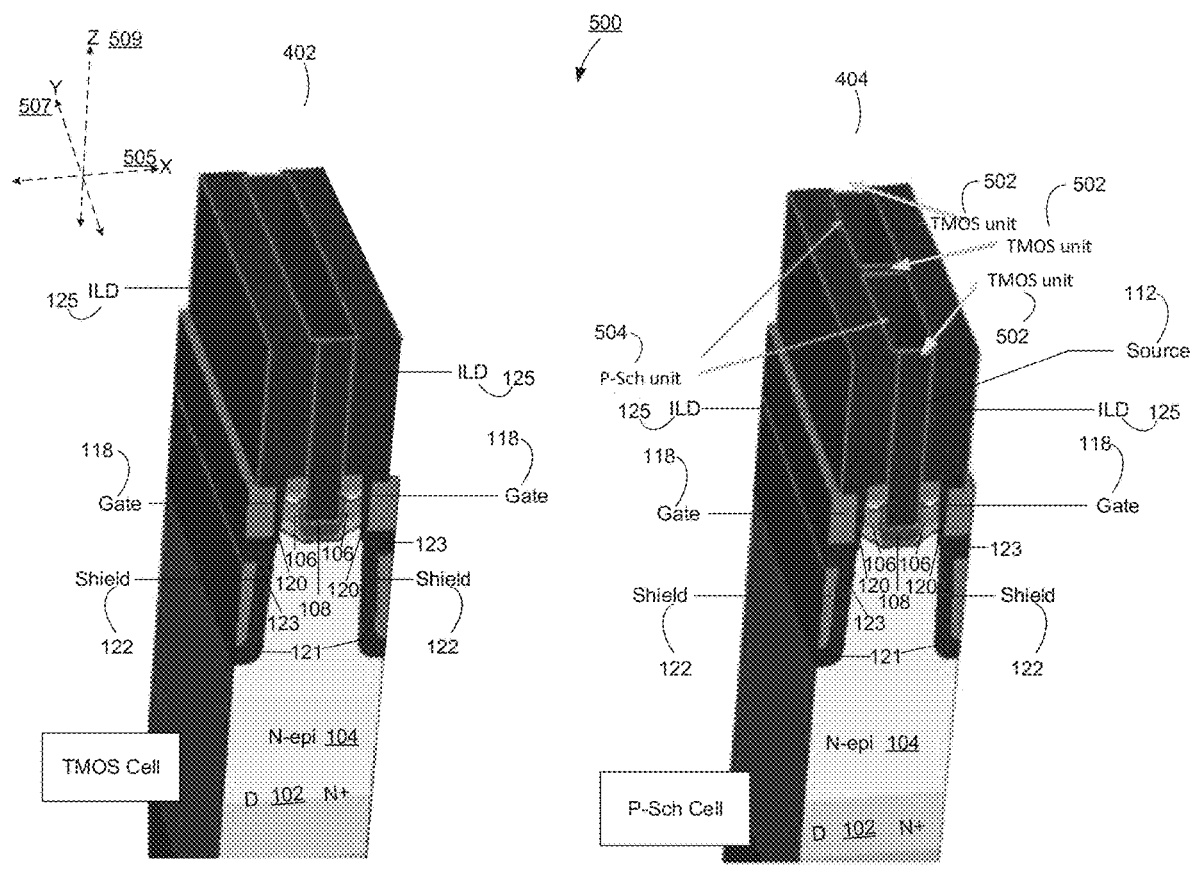
FIG. 5 illustrates a partial three dimensional view of the pseudo Schottky cell of FIG. 4 according to an embodiment of the present disclosure.

Referring to FIG. 5, a partial three dimensional views of a TMOS cell 402 and a P-Sch cell 404 according to a first embodiment of the present disclosure is illustrated. The P-Sch cell 404 comprises at least a single TMOS unit 502 and a single P-Sch unit 504 as shown. In one embodiment there can be a plurality of TMOS units and a plurality of P-Sch units connected in on a common semiconductor substrate. Also shown are a first X axis 505, a second Y axis 507, and a third Z axis 509. It may be appreciated that the X axis 505, Y axis 507, and Z axis 509 form planes XZ, XY, and YZ. In one embodiment, a TMOS unit 502 has the same cross-section as that of the TMOS cell 402 along a first XZ plane but has a smaller length along the second XY plane. Furthermore, the TMOS unit 502 abuts with at least a single P-Sch unit 504 on either of the sides. In some embodiments, it meets two P-Sch units 504, one on each side as shown. In some embodiments, a plurality of TMOS units and P-Sch units may be arranged in an alternating fashion.

In one embodiment, the P-Sch cell 404 may comprise at least a single TMOS unit and a single P-Sch unit connected back-to-back to form an integrated TMOS and pseudo Schottky (TMOS-P-Sch) unit. There may be a plurality of TMOS-P-Sch units in a P-Sch cell in other embodiments. The cell of FIG. 5 comprises a plurality of TMOS units and a plurality of P-Sch units connected in an alternating fashion. In other embodiments, the TMOS units and P-Sch units may be repeated in any fashion as may be suitable for design considerations. The cross-section shown in FIG. 5 is taken along a first axis illustrating a structure of the TMOS unit. As can be seen the structure of this TMOS unit is the same as explained in FIG. 2. Additionally shown in the TMOS unit 402 is the inter-layer dielectric (ILD) 125. As will be explained in more detail with respect to FIG. 6, the P-Sch units 504 according to the present disclosure has a pseudo Schottky source trench region. In other embodiments, the TMOS and P-Sch units in a P-Sch cell may have regular gate trenches as shown in FIG. 1.

Figure 6:
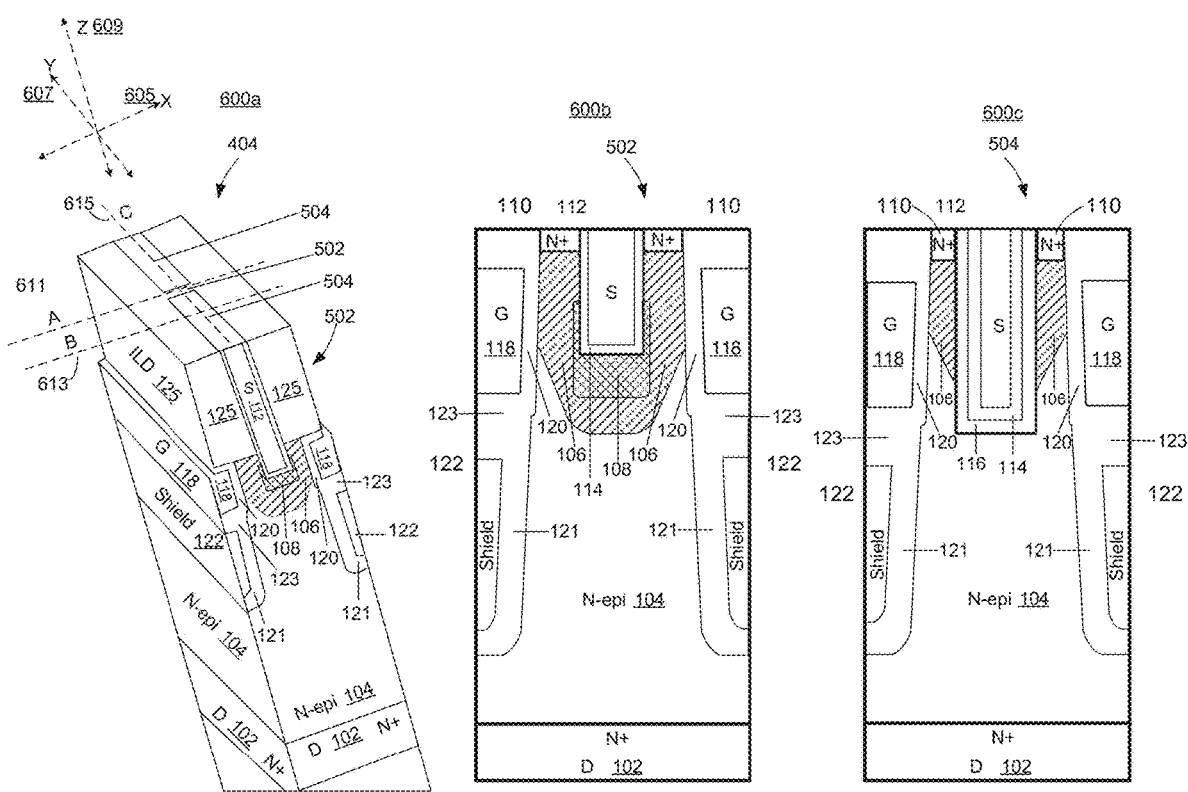
FIG. 6 illustrates another partial three dimensional view and vertical cross-sectional views taken along various planes of the pseudo Schottky cell according to an embodiment of the present disclosure.

Referring to FIG. 6 a partial three dimensional (3D) view 600a, vertical cross-sectional views 600b and 600c of a P-Sch cell 404 of FIG. 5 are shown according to a first embodiment of the present disclosure. Also shown are a first X axis 605, a second Y axis 607, and a third Z axis 609. It may be appreciated that the X axis 605, Y axis 607, and Z axis 609 form planes XZ, XY, and YZ. As such 600b is a cross-sectional view taken along a first plane XZ at line A 611, of the TMOS unit 502 included in the P-Sch cell 404. Similarly. 600c is a cross-sectional view taken along the first plane XZ at line B 613, of the P-Sch unit 504 included in the P-Sch cell 404. The 3D view 600a is similar to the 3D view as shown in FIG. 5 but has been included for clarity. As explained earlier with respect to FIG. 5, the P-Sch cell 404 comprises a plurality of TMOS units (collectively shown as 502) and a plurality of P-Sch units (collectively shown as 504) arranged in an alternating fashion. The cross-sectional view 600b shows the structure of the TMOS unit 502. As can be seen the structure of TMOS unit 502 is similar to that shown in FIG. 2.

The cross-sectional view 600c shows the structure of the P-Sch unit 504 according to an embodiment of the present disclosure. As can be seen the structure of P-Sch unit 504 is also similar to the TMOS unit 502 with a few differences which define a pseudo Schottky source region or contact in an aspect of this disclosure. A first difference between the TMOS unit 502 and P-Sch unit 504 is that unlike TMOS unit 502, the metal layer 114 in P-Sch unit 504 is not directly deposited on the bottoms and the walls of the source trenches but is instead separated by an insulation layer 116 as shown. As can be seen, the insulation layer 116 may be grown at the bottoms and the walls of the trench source regions 112 in the P-Sch units. In one example, the insulation layer 116 may be a thermally grown oxide layer. A conductive layer 114 is deposited over the insulation layer 116 covering the insulation layer 116. In some embodiments, the conductive layer 114 may fully or partially cover the insulation layer 116. In other embodiments, the insulation layer 116 may partially cover the source bottoms and source walls. In the example shown the conductive layer 114 is a metal layer and may be referred to as a source barrier metal layer.

In one example, the insulation layer 116 may be a thin oxide layer. Further, the insulation layer may have a thickness in the range of 5 Å (angstroms) to 150 Å (angstroms) and may vary in other examples, depending on design considerations. In one example, the metal layer 114 may be comprised of Ti/TiN. Other metals or conductive materials may also be used. The depth of the metal layer 114 in the example shown may be in the range of 0.2 μm to 0.5 μm, but may vary depending on design considerations.

A second difference between the TMOS unit 502 and the P-Sch unit 504 is that there is no p+ region 108 beneath the source region 112. Further, the source region 112 is at a lower depth than the source region 112 of the TMOS unit 502 as shown and the insulating layer penetrates through the p− body region 106. More specifically, the bottom of layer 116 is below the bottom of the region 106.

The insulation layer 116 along with the conductive layer 114 form a pseudo Schottky diode which as the name suggests is different from a real Schottky diode. Due to this configuration, the conductive layer 114 is electrically isolated from the surrounding p-body region 106, n+ source region 110, n-epi layer 104, and the n+ substrate 102. It is well known in the art that a Schottky diode has a lower forward voltage drop and leakage current compared to a regular p-n junction diode. The pseudo Schottky diode per this embodiment has a leakage current even lower than a regular Schottky diode because of the conductive layer being separated by the insulation layer. The intrinsic body diode conduction of the MOSFET 100 is thus much lower compared to the body diode of any other MOSFET that has a metal layer directly deposited in source trenches. As such, the integrated pseudo Schottky diode improves the reverse recovery performance of the MOSFET 100 resulting in a better efficiency when used especially in switching applications. The improved performance of the MOSFET may be evident from the simulation results, examples of which are presented below.

It may be appreciated by one skilled in the art that a P-Sch cell 404 may be viewed as a MOSFET having a source region, the source region having two sub regions. The first sub region is a TMOS source region forming an Ohmic contact (metal to semiconductor) connection. The Ohmic contact includes metal to N+ source and metal to P+ region. The second sub region is a P-Sch source region forming a pseudo Schottky structure.

Figure 7:
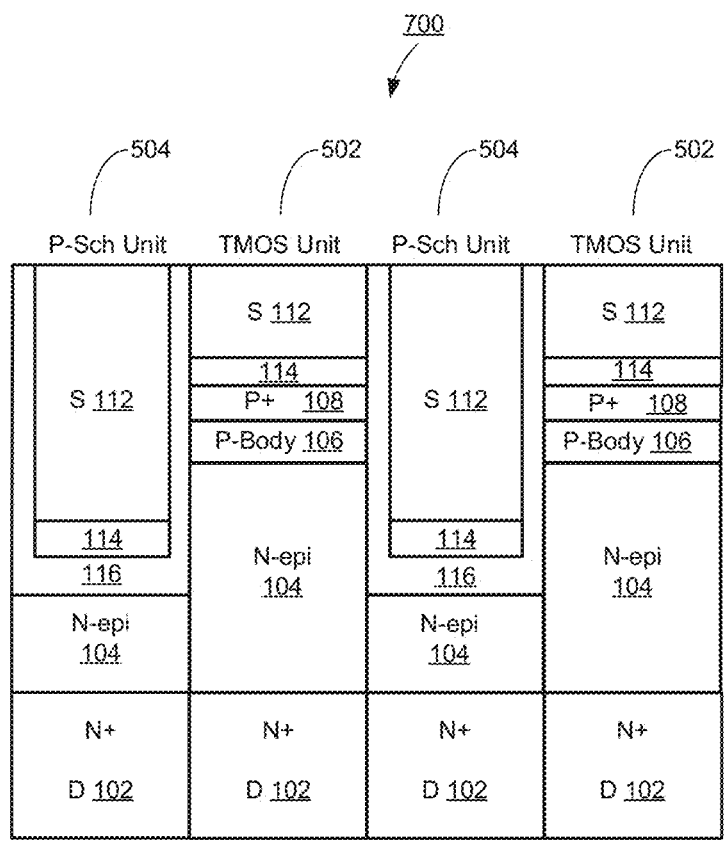
FIG. 7 illustrates a partial vertical cross-sectional view taken along another plane of the pseudo Schottky cell of FIG. 6 according to an embodiment of the present disclosure.

Referring to FIG. 7, a partial vertical cross-sectional view 700 taken along the second YZ plane at line C 615 of the P-Sch cell 404 of FIG. 6 is illustrated. As shown, the P-Sch cell 404 includes TMOS units 502 and P-Sch units 504 arranged back-to-back. It may be appreciated that, in this view of P-Sch units 504, various layers can be seen comprising source regions 112, insulation layer 116, dielectric 121, n-epi 104, and n+ 102. As can be seen, the insulation layer 116 may have a greater thickness at the bottom than at the sidewalls of source region 112. Further, in this view of TMOS units 502, various layers can be seen comprising source regions 112, metal layer 114, p+ regions 108, p-body regions 106, n-epi 104, and n+ 102. It may be appreciated that the insulation layer 116 is not seen in TMOS units 502.

Figure 8:
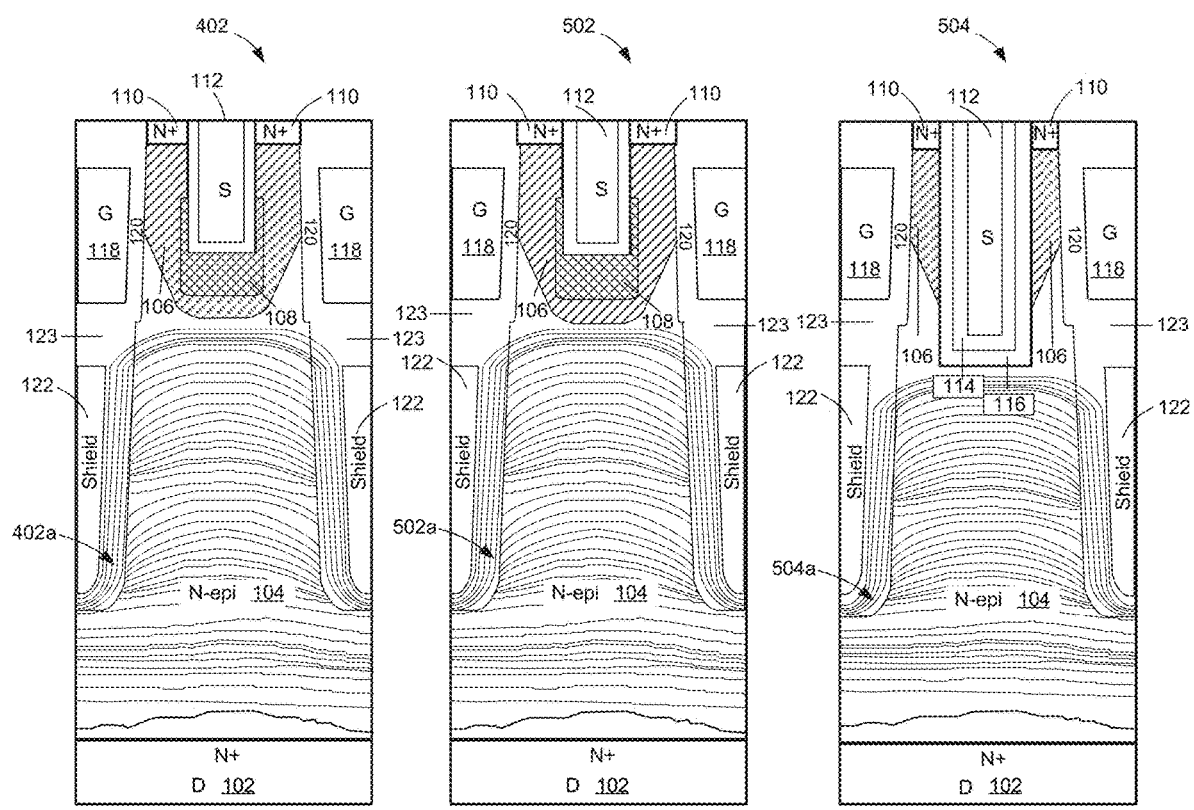
FIG. 8 illustrates partial cross-sectional views and breakdown voltage distribution in the pseudo Schottky cell of FIG. 6.

Referring to FIG. 8, partial cross-sectional views of a regular TMOS cell 402 as shown in FIG. 2, a TMOS unit 502 of the P-Sch cell 404, and an integrated P-Sch unit 504 of the P-Sch cell 404 and their corresponding potential contours at breakdown in an off state are illustrated. In an off state, the cells 402, 502, and 504 may have potential contours at breakdown as shown by 402a, 502a, and 504a respectively. The potential contours 402a, 502a, and 504a are example results of a TCAD simulation. As can be seen, the potential contour in all the three structures is very similar, representing nearly the same drain to source voltage. As such, the TMOS unit and the P-Sch unit can withstand the same amount of breakdown drain to source voltage (Bvnss) as a regular TMOS. In one example, the $B_{VDSS}$ of the TMOS unit 502 and P-Sch unit 504 is at least 5V.

Figure 9:
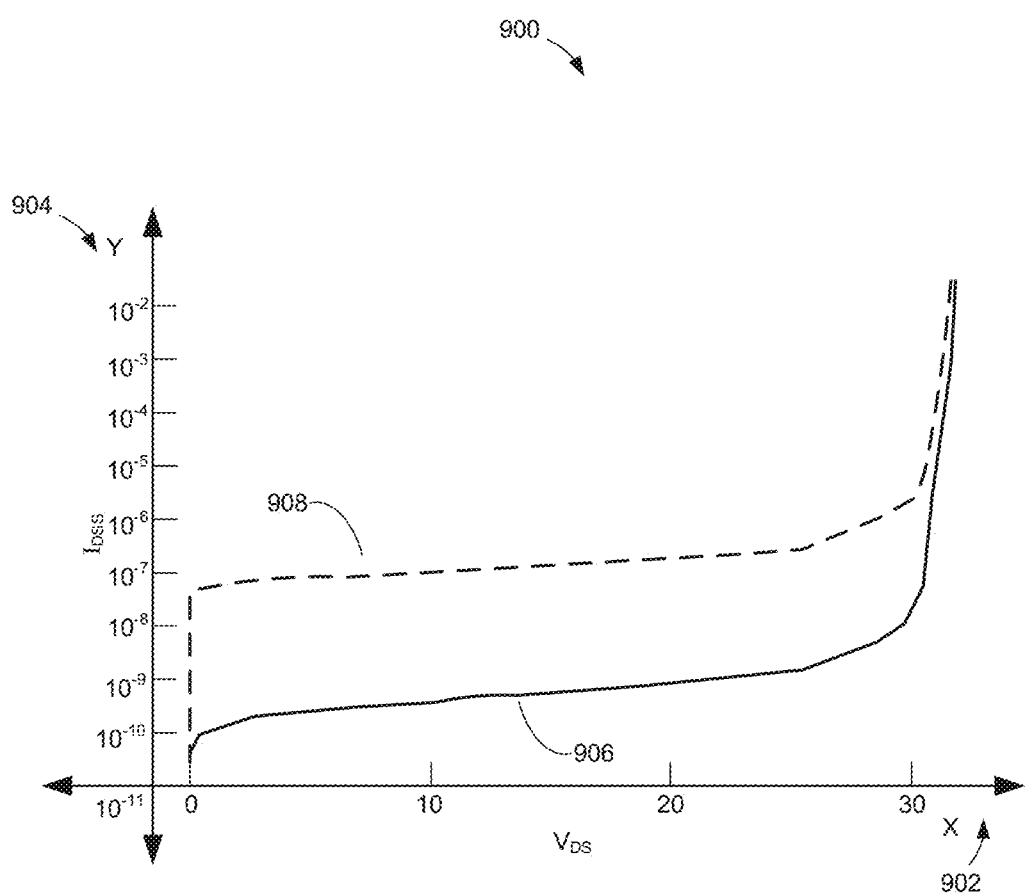
FIG. 9 illustrates a graph of voltage versus current for the pseudo Schottky cell of FIG. 6.

FIG. 9 provides a graphical example 900 of curves 906 and 908 of drain to source voltage (Vs) versus drain to source current ($I_{DSS}$) for the semiconductor device 300 comprising only basic TMOS cells as shown in FIG. 3 and the integrated semiconductor device 400 comprising both basic TMOS and P-Sch cells as shown in FIG. 4, respectively. The curves 906 and 908 are results of a TCAD simulation. The X axis 902 represents the $V_{DS}$. The Y axis 904 represents the $I_{DSS}$. As can be seen from the curve 908, the P-Sch cell 404 can conduct a higher $I_{DSS}$ for the same amount of $V_{DS}$ compared to a regular TMOS. In one example, for a range of $V_{DS}$ from 0 volts to 30 volts, for a regular TMOS cell, the value of leakage current when the device is turned off may range from 0 to $10^{-9}$ A/mm², whereas for a P-Sch cell, the value of leakage current when the device is turned off may range from 0 to $10^{-6}$ A/mm². The value of operating mode current of the _P-Sch cell may range from a few oms to a few hundred ohms. The currents shown are for a MOSFET die having an active area of 1 mm². It may be appreciated that the currents may vary as the die size varies, however the current density will remain the same.

Figure 10:
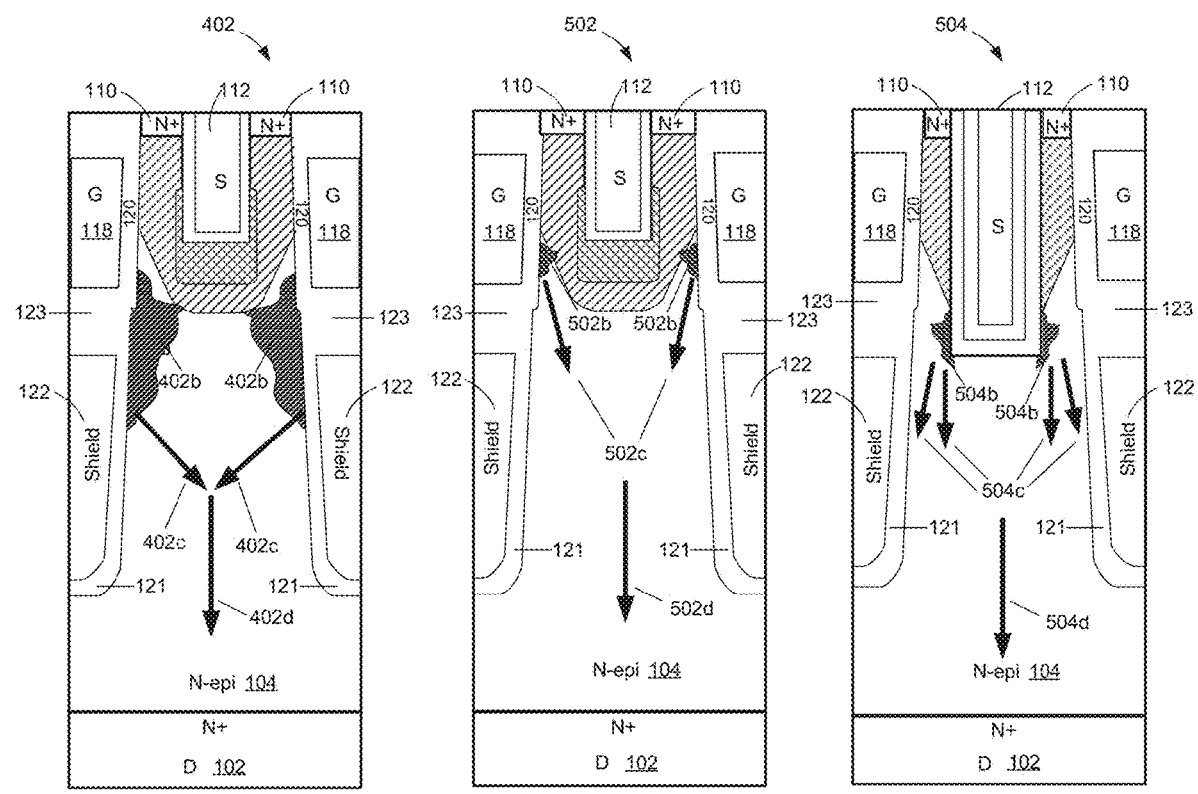
FIG. 10 illustrates partial cross-sectional views and current distributions in the pseudo Schottky cell of FIG. 6.

Referring to FIG. 10, cross-sectional views of a TMOS cell 402, a TMOS unit 502, and a P-Sch unit 504 are illustrated along with the directions of their body diode currents and current distribution patterns in their corresponding body diodes in a forward conduction mode. This current in the forward conduction mode may also be referred to as body diode forward current. For the TMOS cell 402, the body diode current distribution pattern is illustrated by 402b and the body diode current direction is indicated by the arrows 402c 402d. Similarly, for TMOS unit 502, the body diode current distribution pattern is illustrated by 502b and the body diode current direction is indicated by the arrows 502c and 502d. In the TMOS cell 402, the current mainly flows through the MOSFET channel, then spreads as indicated by the arrows 402b and then flows vertically as indicated by the arrow 402d. For the P-Sch unit 504, the body diode current distribution pattern is illustrated by 504b and the body diode current direction is indicated by the arrows 504c and 504d. As can be seen, in the TMOS cell 402, the direction of body diode forward current 402c is vertical from source to drain. The current distribution pattern 402b also substantially extends to the center of the shields 122. This indicates that the body diode conducts heavily in the regular TMOS. In the TMOS unit 502, the body diode forward current direction 502c is slanted or lateral from the gate toward the drain. The current distribution patterns 502c extend up to just below the gate regions 118. This indicates that the current in much lower as compared to the regular TMOS cell 402. The flow of current in the TMOS unit 502 is very similar to, but is very much smaller than the flow of current in the TMOS cell 402. In the P-Sch unit 504, the forward current is carried by the electrons and the direction 504c of the forward current is vertical from source to drain. The current distribution patterns 504b appear along the sidewall of the source trench as is shown. This indicates that the current is much lower as compared to the regular TMOS cell 402. Thus, it may be appreciated that in the integrated device 400 of FIG. 4, for the P-Sch cell 404 (comprising the TMOS unit 502 and the P-Sch unit 504), the body diode forward current is much smaller than the regular TMOS cell 402.

Figure 11:
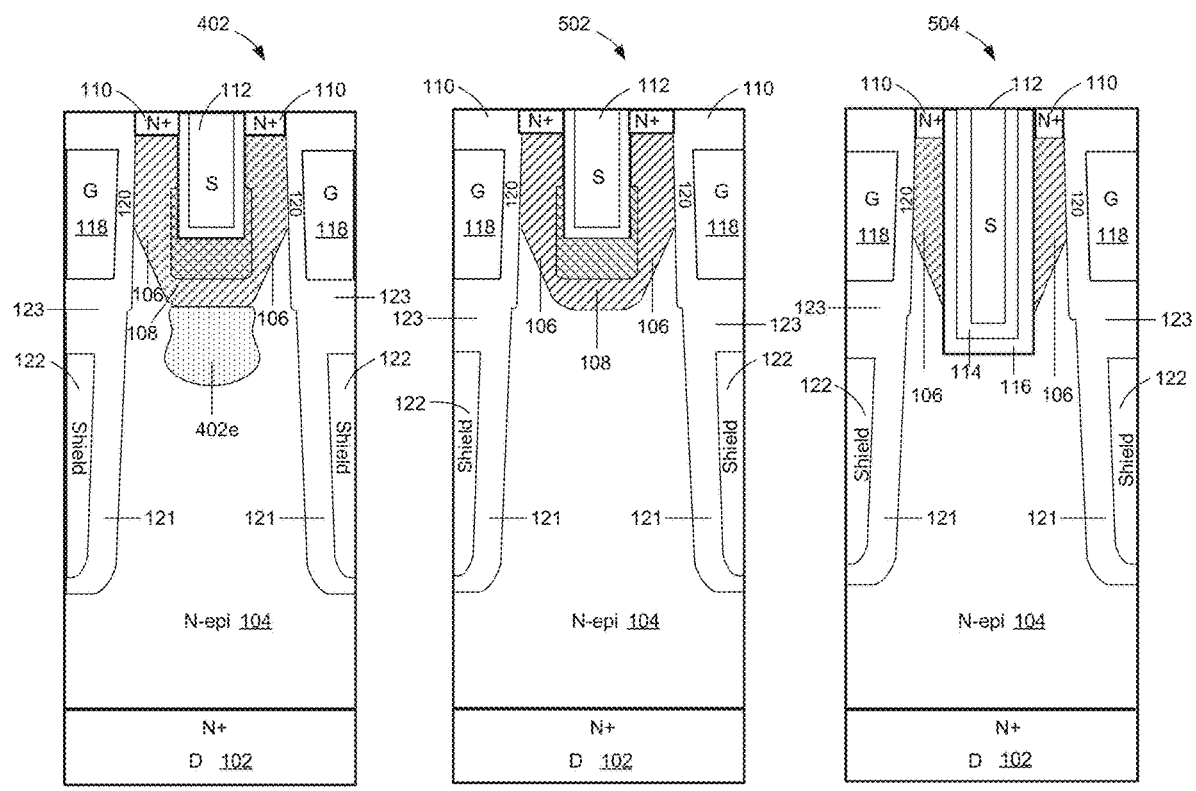
FIG. 11 illustrates partial cross-sectional views and charge carrier distribution in the pseudo Schottky cell of FIG. 6.

Referring to FIG. 11, cross-sectional views of a regular TMOS cell 402, a TMOS unit 502 of the P-Sch cell 404, and an integrated P-Sch unit 504 of the P-Sch cell 404 are illustrated along with their corresponding hole current distributions in a forward conduction mode. For the regular TMOS cell 402, the hole current distribution is illustrated by a region 402e underneath the source. In an n-channel MOSFET, region 402e comprises holes. As can be seen, there is a substantially large hole injection underneath the p+ type region 108 in the regular TMOS cell 402. In TMOS unit 502 and P-Sch unit 504, the charge carrier distribution is negligible or substantially zero. Thus, in the integrated device 400 of FIG. 4, the TMOS unit 502 and the P-Sch unit 504 in the P-Sch cell 404 together substantially eliminate hole injection in diode forward conduction mode.

Figure 12:
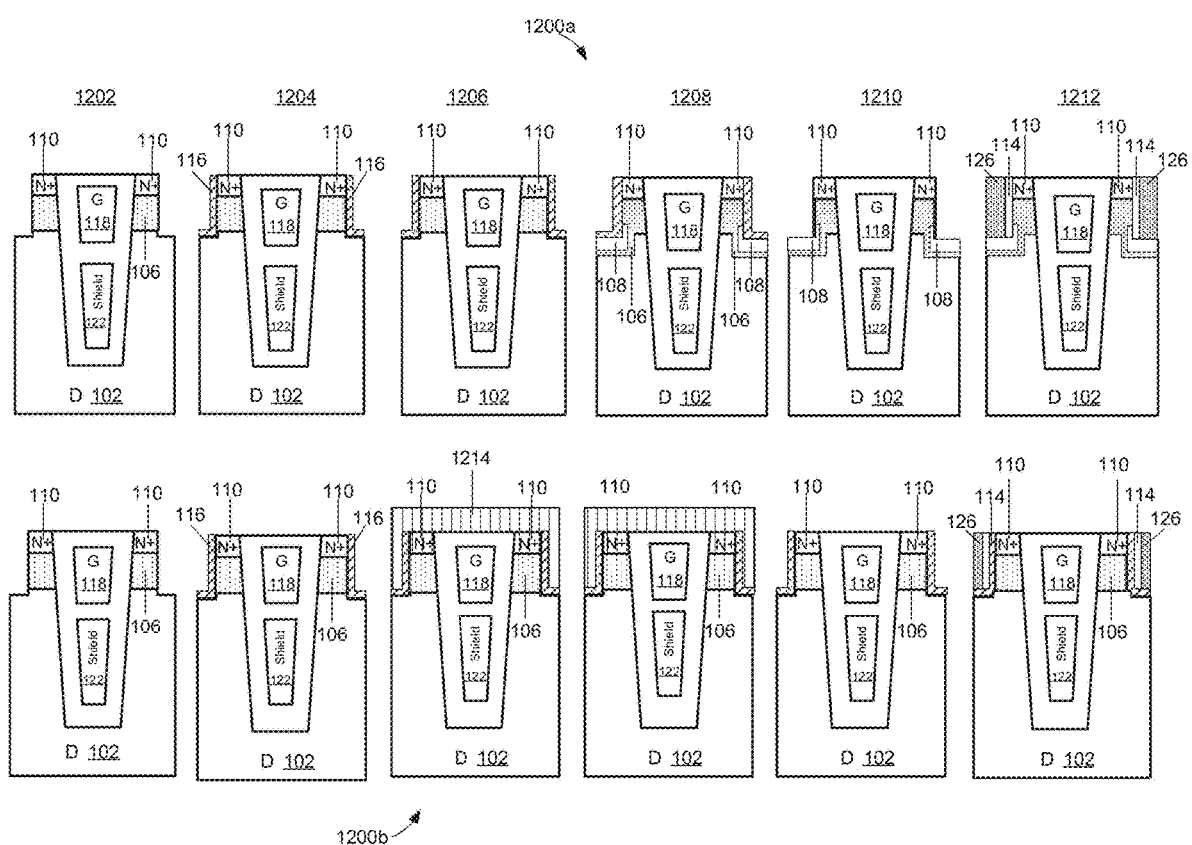
FIG. 12 illustrates placement of physical layout masks for fabrication of the pseudo Schottky cell of FIG. 6. According to a first example.

Referring to FIG. 12, cross-sectional views of the TMOS 502 unit and P-Sch unit 504 are illustrated at various stages of a fabrication process according to a first example, in order to create the P-Sch cell 404 of FIG. 5 during the overall MOSFET fabrication. In the first example, a thin oxide layer is formed in the source regions 112 before forming the p-body and p+ regions. Further, 1200a shows cross-sectional views of the TMOS unit 502 and 1200b shows cross-sectional views of the integrated P-Sch unit 504. The fabrication process for integrating P-Sch cell 404 may comprise six stages 1202, 1204, 1206, 1208, 1210, and 1212. Both TMOS unit 502 and P-Sch unit 504 progress through these stages simultaneously.

Stage 1202 shows cross-sectional views of the TMOS unit 502 and P-Sch unit 504 before the masking process has begun. It may be assumed that prior to this stage in the units 502 and 504 drain regions, trench gate regions, trench shield gate regions, p-body regions, n+ source, and trench source contact regions have already been formed.

At stage 1204, an insulation layer may be formed in the source regions in both units 502 and 504 simultaneously.

At stage 1206, a photoresist layer 1214 may be deposited and patterned to selectively cover unit 504.

At stage 1208, the p+ regions 108 and p-body extension may be formed in the unit 502. The p+ regions and p-body extension do not form in the P-Sch unit 304 due to the photo resist covering.

At stage 1210, the insulation layer 116 may be stripped off the TMOS unit 502 and the photoresist 1214 may be stripped off the P-Sch unit 504.

At stage 1212 a Ti/TiN metal layer 114 may be deposited in both TMOS unit 502 and P-Sch unit 504. After the deposition of the metal layer 114, another thin metal layer referred to as a Tungsten plug 126 is deposited in the TMOS unit 502 and the P-Sch unit 504. After the stage 1212, top metal and passivation may be performed which results in a finished device P-Sch cell 404 of FIG. 5. It may be appreciated that there may be additional stages in other embodiments.

Figure 13:
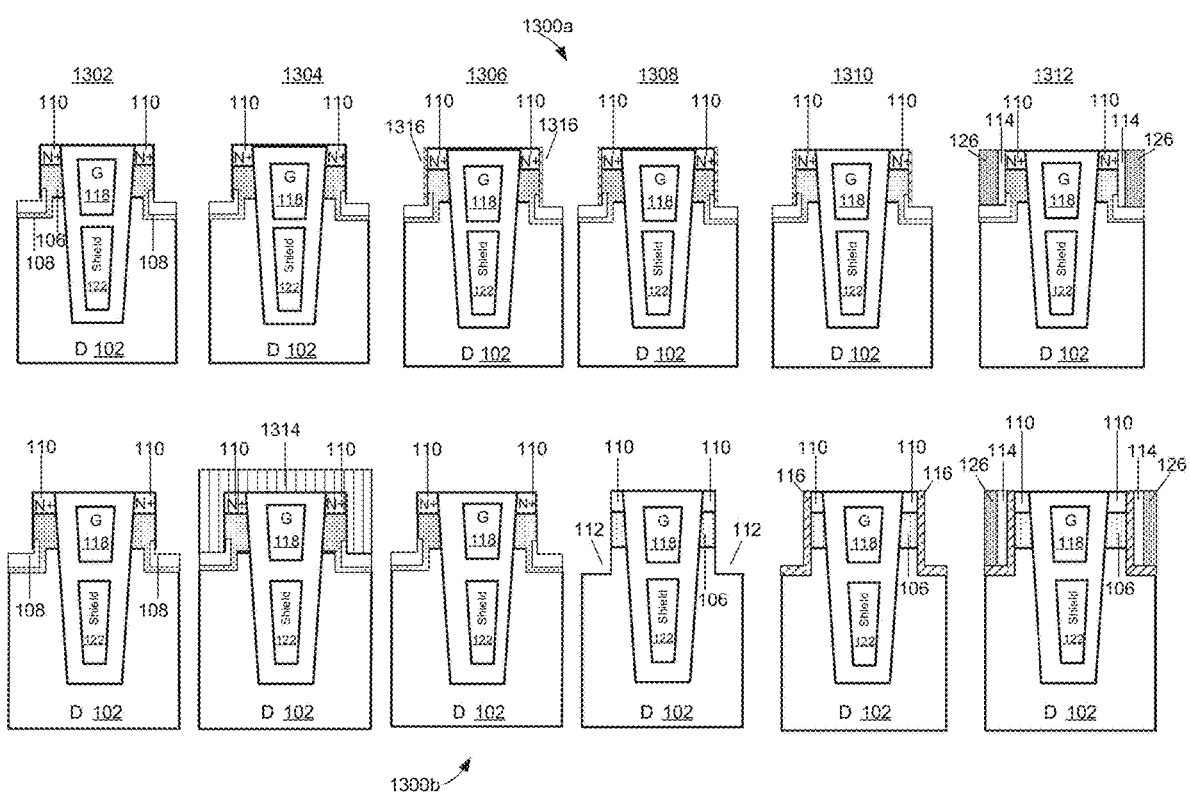
FIG. 13 illustrates physical layout masks for fabrication of the pseudo Schottky cell of FIG. 6. according to a second example method.

Referring to FIG. 13, cross-sectional views of the TMOS unit 502 and P-Sch unit 504 are illustrated at various stages of a fabrication process according a second example in order to create the P-Sch cell 404 of FIG. 5 during the overall MOSFET fabrication. In the second example, an insulation layer is formed in the source regions 112 after forming the p-body and p+ regions. Further, 1300*a* shows cross-sectional views of the TMOS unit 502 and 1300*b* shows cross-sectional views of the P-Sch unit 504. The fabrication process may comprise six stages 1302, 1304, 1306, 1308, 1310, and 1312. Both TMOS unit 302 and P-Sch unit 304 progress through these stages simultaneously.

Stage 1302 shows cross-sectional views of the units 502 and 504 before the fabrication process has begun. It may be assumed that prior to this stage in the units 502 and 504 drain regions, trench gate regions, trench shield gate regions, p-body regions, n+ source, p+ regions, and trench source contact regions have already been formed.

At stage 1304, a photoresist layer 1314 may be deposited and patterned to selectively cover unit 504.

At stage 1306, a thin layer 1316 of nitride may be deposited in the source regions of the TMOS unit 502. Since the P-Sch unit 504 is covered by the photoresist, the nitride layer 1316 is not be deposited. The photoresist mask 1314 may be stripped off the P-Sch unit 504.

At stage 1308, the source contact trench 112 in the P-Sch unit 504 may be widened and deepened by etching the exposed semiconductor. The p+ regions and the bottom portion of the p-body may be thus removed in this process.

At stage 1310, an insulation layer 116 may be formed in the source regions in the P-Sch unit 504. The insulation layer 116 may be a thermally grown oxide formed by oxidizing the silicon. The Nitride layer 1316 in the TMOS unit 502 will prevent the silicon from being oxidized.

At stage 1312, the nitride layer 1316 may be removed from the TMOS unit 502. Further a Ti/TiN metal layer 114 may be deposited in both TMOS unit 502 and P-Sch unit 504. After the deposition of the metal layer 114, another thin metal layer referred to as a Tungsten plug 126 is deposited in the TMOS unit 502 and the P-Sch unit 504. After the stage 1312, top metal and passivation may be performed which results in a finished device P-Sch cell 404 of FIG. 5. It may be appreciated that there may be additional stages in other embodiments. It may be appreciated that there may additional stages in other embodiments.

Figure 14:
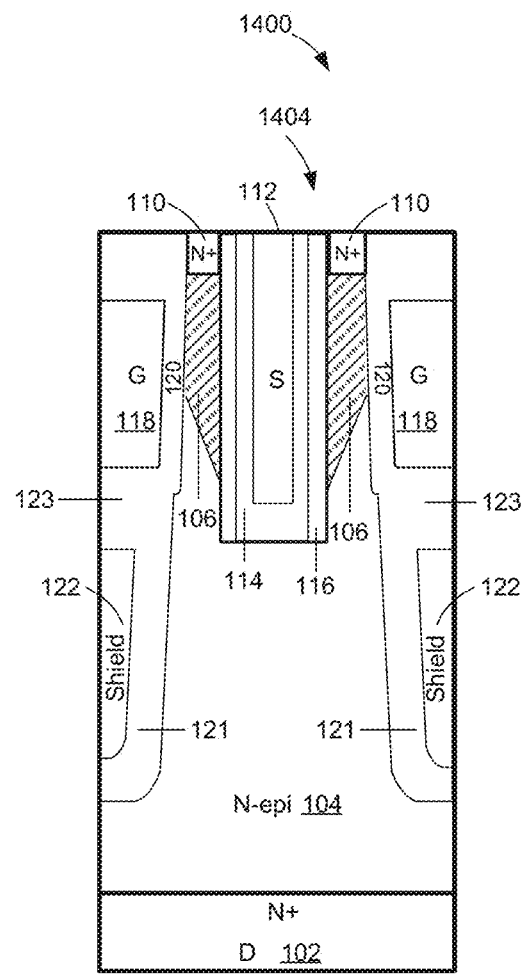
FIG. 14 illustrates a partial vertical cross-sectional view 1400 of a P-Sch unit 1404 according to a second embodiment of the present disclosure.

Referring to FIG. 14, a partial vertical cross-sectional view 1400 of a P-Sch unit 1404 according to a second embodiment is illustrated. The source region 112 of unit 1404 is a bottom opened Schottky source region. In other words, there is no insulation layer 116 at the bottom of the source trench; and the conductive layer 114 forms a real Schottky contact on the n-epi 104 underneath.

Advantageously, in the configurations shown in FIGS. 12, 13, and 14, no active area of the MOSFET is wasted.

Figure 15:
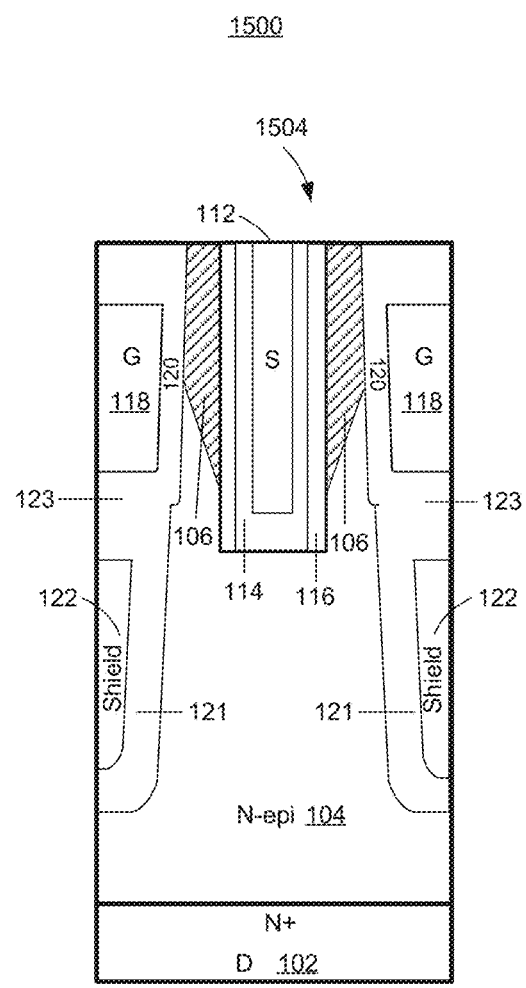
FIG. 15 illustrates a partial vertical cross-sectional view 1500 of a P-Sch unit 1504 according to a second embodiment of the present disclosure.

Referring to FIG. 15, a partial vertical cross-sectional view 1500 of a P-Sch unit 1504 according to a second embodiment is illustrated. The unit is 1504 can be mostly similar to the unit 1404 of FIG. 14 except for one difference. It differs from the unit 1404 in that there is no n+ regions present in it. As such, there is only a single p-n junction which may improve device robustness by eliminating the possibility of a parasitic npn latch-up. Advantageously, a device having a configuration as shown in FIG. 14 or FIG. 15 may further lower the forward voltage at a high current density.

An embodiment of a P-Sch unit 504 as shown in FIG. 5 or FIG. 6 may have regular gate trenches as shown in FIG. 1.

Figure 16:
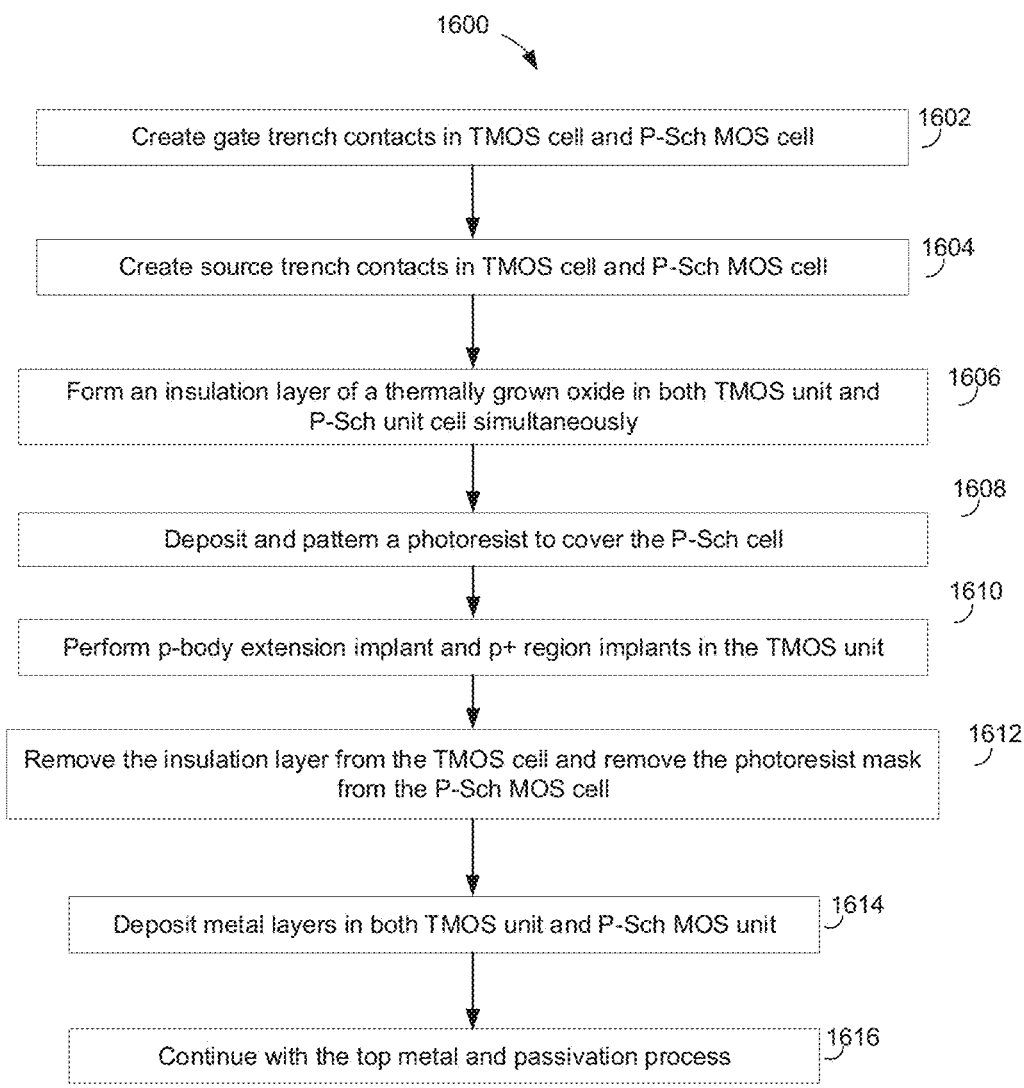
FIG. 16 illustrates a flow diagram of making the semiconductor device of FIG. 3 according to a first example method involving the placement masks per FIG. 8.

FIG. 16 illustrates a flow diagram 1600 of fabrication steps for making the P-Sch cell 404 of FIG. 4 according to the method as illustrated in FIG. 8.

Referring to FIG. 16, at 1602 gate trenches may be created in the TMOS units and P-Sch units on a semiconductor surface.

At 1604 source trenches may be created in the TMOS units and P-Sch units on a semiconductor surface.

At 1606, an insulation layer 116 of a thermally grown oxide may be formed in both TMOS unit 502 and P-Sch unit 504 simultaneously. An example of this is shown in 1204 in FIG. 12. Insulation layer 116 is formed in both TMOS unit 502 and P-Sch unit 504.

At 1608, a photoresist layer may be deposited and patterned to cover the P-Sch units. An example of this is shown in 1206 in FIG. 12. The photoresist layer 1214 is deposited and patterned to cover the P-Sch unit 504.

At 1610, p-body extension region and p+ region implantations may be performed in TMOS units. An example of this is shown in 1208 in FIG. 12. The p-body extension region 106 and p+ region implantations 108 are performed in TMOS unit 502.

At 1612, the insulation layer may be removed from the TMOS unit 502 and the photoresist mask may be removed. An example of this is shown in 1210 in FIG. 12. The insulation layer 116 is removed from the TMOS unit 502 and the photoresist mask 1214 may be removed from the P-Sch unit 504.

At 1614, metal layers may be deposited in both TMOS unit and P-Sch unit. An example of this is shown in 1212 in FIG. 12. Metal layers 114 and 126 are formed in TMOS unit 502 and P-Sch unit 504.

At 1616, top metal and passivation process may be performed resulting in a finished device.

Figure 17:
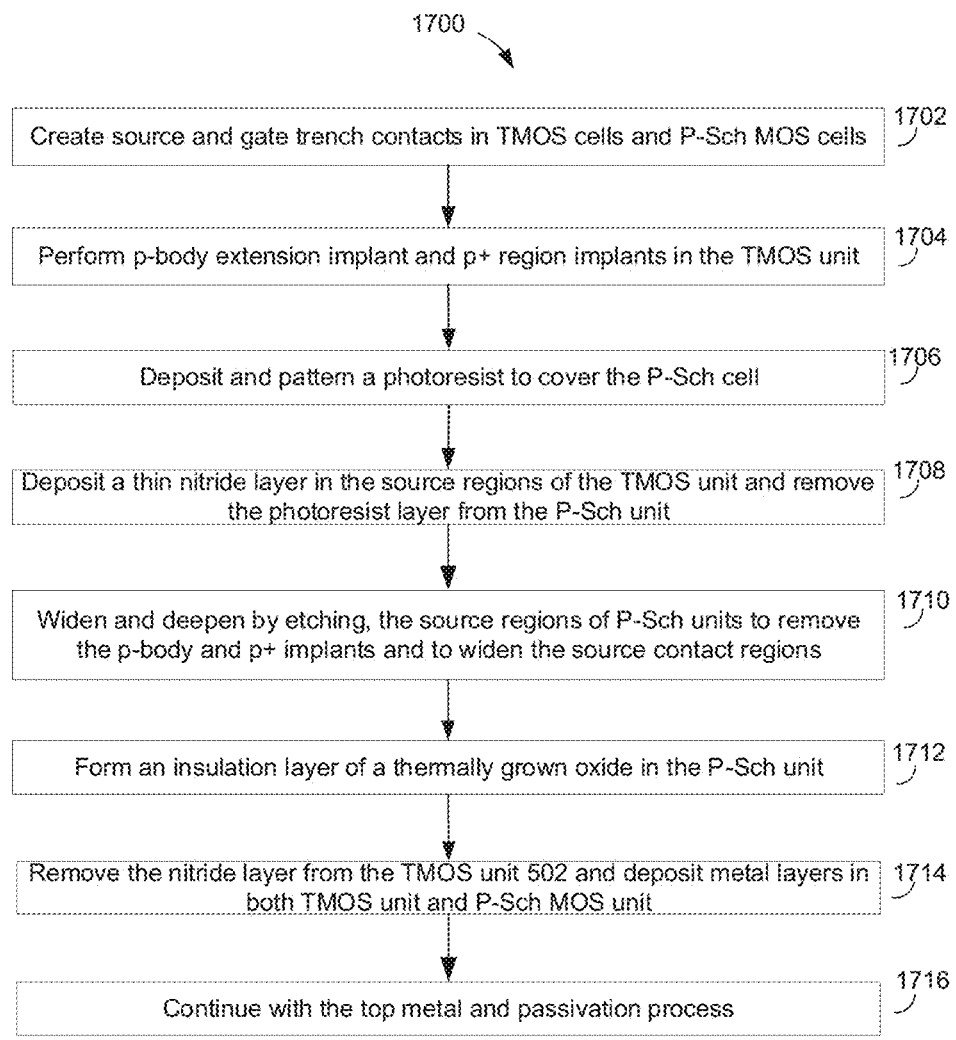
FIG. 17 illustrates a flow diagram of making the semiconductor device of FIG. 3 according to a second example method involving the placement masks per FIG. 9.

FIG. 17 illustrates a flow diagram 1700 of fabrication steps for making the P-Sch cell 404 of FIG. 5 according to the method as illustrated in FIG. 9.

At 1702, gate trenches may be created in the TMOS units and P-Sch units on a semiconductor surface.

At 1704, p-body extension region and p+ region implantations may be performed in the TMOS and P-Sch units. An example of this is shown in 1302 in FIG. 13. The p-body extension regions 106 and p+ region implantations 108 are formed in TMOS unit 502 and P-Sch unit 504.

At 1706, a photoresist layer may be deposited and patterned to cover the P-Sch unit. An example of this is shown in 1304 in FIG. 13. The photoresist layer 1314 is deposited and patterned to cover the P-Sch unit 504.

At 1708, a thin layer of nitride may be deposited in the source regions of the TMOS unit 502 and further the photoresist layer may be stripped off the P-Sch unit. An example of this is shown in 1306 in FIG. 13. The nitride layer 1314 is in the source regions of the TMOS unit 502. The nitride layer 1314 does not get deposited in the P-Sch unit 504. Further the photoresist layer 1314 is stripped off the P-Sch unit 504.

At 1710, etching may be performed in the source regions of P-Sch unit to widen and deepen the source trench and to remove the p+ and bottom p-body regions. An example of this is shown in 1308 in FIG. 13. The source contact trenches of the P-Sch unit 504 are widened and deepened by etching the exposed semiconductor. The P+ regions 108 and bottom portions of p-body are removed in the P-Sch unit 504.

At 1712, an insulation layer of a thermally grown oxide (by oxidizing silicon) may be formed in the P-Sch unit. An example of this is shown in 1310 in FIG. 13. The insulation layer 116 is formed in the P-Sch unit 504. The Nitride layer 1316 in the TMOS unit 502 prevents the silicon from being oxidized and thus insulation layer 116 from being formed in the TMOS unit 502.

At 1714, the nitride layer may be stripped of the TMOS unit and metal layers may be deposited in both TMOS unit and P-Sch unit. An example of this is shown in 1312. The nitride layer 1316 is removed from the TMOS unit 502. Further the metal layer 114 is deposited in TMOS unit 502 and P-Sch unit 504. After the deposition of the metal layer 114, another thin metal layer referred to as a Tungsten plug 126 is deposited in the TMOS unit 502 and the P-Sch unit 504.

At 1716, top metal and passivation process may be performed resulting in a finished device.

Although the present embodiments have been particularly described with reference to preferred examples thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. An insulated gate semiconductor device comprising:
    a region of semiconductor material comprising:
        a semiconductor substrate;
        a first semiconductor layer of a first conductivity type on the substrate;
        an epitaxial layer of the first conductivity type grown on the substrate;
        a body region of a second conductivity type formed in the epitaxial layer;
        a second semiconductor layer of the first conductivity type on the epitaxial layer having a major surface; and
        a plurality of TMOS cells and a plurality of pseudo Schottky (P-Sch) cells, disposed either on the second semiconductor layer or on the epitaxial layer, adjacent and abutting each other, such that each of the plurality of the P-Sch cells is sandwiched between any two of the plurality of the TMOS cells,
    wherein each of the plurality of TMOS cells is configured to form an ohmic contact in the body region, and
    wherein each of the plurality of P-Sch cells is configured to form a pseudo Schottky barrier diode with the body region.

2. The device according to claim 1, wherein each of the plurality of TMOS cells further comprises:
    a first trench gate region having sidewalls and a bottom;
    a second trench gate region having sidewalls and a bottom; and
    a trench source region having sidewalls and a bottom,
    wherein the first and the second gate regions include a layer of a dielectric material on the side walls and the bottom, and
    wherein the trench source region includes a layer of conductive material covering the side walls and on the bottom to form a real Schottky contact with the body region.

3. The device according to claim 2, wherein each of the plurality of TMOS cells further comprises:
    a first shield region recessed in the first trench gate region; and
    a second shield region recessed in the second gate region.

4. The device according to claim 3, wherein each of the plurality of P-Sch cells further comprises:
    a first shield region recessed in the first trench gate region; and
    a second shield region recessed in the second gate region.

5. The device according to claim 4, wherein each of the plurality of P-Sch cells further comprises a TMOS unit and a P-Sch unit arranged in a back-to-back fashion, wherein the TMOS unit has a structure similar to that of the TMOS cell, and wherein the P-Sch unit further comprises:
    a first trench gate region having sidewalls and a bottom;
    a second trench gate region; and
    a trench source region having sidewalls and a bottom,
    wherein the first and the second trench gate regions include a layer of dielectric material on the bottoms and the side walls, and
    wherein the trench source region includes a first layer of an insulating material covering the bottoms and the side walls, and further includes a second layer of a conductive material covering the layer of the insulating material to form a pseudo Schottky contact with the body region.

6. The device according to claim 4, wherein each of the plurality of P-Sch cells further comprises a TMOS unit and a P-Sch unit arranged in a back-to-back fashion, wherein the TMOS unit has a same structure as the TMOS cell, and wherein the P-Sch unit further comprises:
    a first trench gate region having sidewalls and a bottom;
    a second trench gate region; and
    a trench source region having sidewalls and a bottom,
    wherein the first and the second trench gate regions include a layer of dielectric material on the bottom and the side walls, and
    wherein the trench source region includes a first layer of an insulating material covering the side walls, and further includes a second layer of a conductive material covering the bottom of the trench source region and the layer of the insulating material on the sidewalls and to form a bottom opened Schottky contact with the epitaxial layer;
    and to form a Pseudo-Schottky contact with the sidewalls.

7. The device according to claim 6, wherein the trench gate regions extend from the major surface and terminate in the epitaxial layer.

8. The device according to claim 6, wherein the trench source regions extend from the major surface and terminate in the body region.

9. The device according to claim 6, wherein each of the plurality of the TMOS cells includes localized doped regions of the second conductivity type underneath the trench source region.

10. The device according to claim 1, wherein a breakdown voltage of the device is at least 5V.

11. The device according to claim 1, having a maximum leakage current of $10^{-6}$ A/mm$^2$ when turned off.

12. The device according to claim 1, wherein a doping concentration of the epitaxial layer is lower than the doping concentration of the first semiconductor layer.

13. The device according to claim 1, wherein the doping concentration of the epitaxial layer is lower than the doping concentration of the second semiconductor layer.

14. The device according to claim 1, wherein the P-Sch cell further comprises a plurality of TMOS units and a plurality of P-Sch units arranged in a back-to-back alternating fashion.

15. The device according to claim 1, wherein the device has a diode forward voltage drop of about 0.3V.

16. The device according to claim 2, wherein each of the plurality of P-Sch cells further comprises a TMOS unit and a P-Sch unit arranged in a back-to-back fashion, wherein the TMOS unit has a structure similar to that of the TMOS cell, and wherein the P-Sch unit further comprises:
    a first trench gate region having sidewalls and a bottom;
    a second trench gate region; and
    and a trench source region having sidewalls and a bottom, wherein the first and the second trench gate regions include a layer of dielectric material on the bottoms and the side walls, and
    wherein the trench source region includes a first layer of an insulating material covering the side walls, and further includes a second layer of a conductive material covering the bottom of the trench source region and the layer of the insulating material on the sidewalls and to form a bottom opened Schottky contact with the epitaxial layer; and to form a Pseudo-Schottky contact with the sidewalls; and
    wherein the P-Sch unit is disposed directly on the body region.

17. The device according to claim 3, wherein the insulation layer has a thickness between about 5 angstroms and 150 angstroms.

18. The device according to claim 3, wherein the conductive layer has a depth between about 0.2 micrometers and 0.5 micrometers.

* * * * *